(12) United States Patent
Nho et al.

(10) Patent No.: US 8,173,039 B2
(45) Date of Patent: May 8, 2012

(54) METHOD FOR PREPARING CERIUM OXIDE POWDER USING ORGANIC SOLVENT AND CMP SLURRY COMPRISING THE SAME

(75) Inventors: Jun-Seok Nho, Daejeon (KR); Myoung-Hwan Oh, Daejeon (KR); Seung-Beom Cho, Daejeon (KR); Jong-Pil Kim, Daejeon (KR); Jang-Yul Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 231 days.

(21) Appl. No.: 12/312,601

(22) PCT Filed: Nov. 20, 2007

(86) PCT No.: PCT/KR2007/005815
§ 371 (c)(1),
(2), (4) Date: Jul. 6, 2009

(87) PCT Pub. No.: WO2008/062978
PCT Pub. Date: May 29, 2008

(65) Prior Publication Data
US 2010/0044625 A1 Feb. 25, 2010

(30) Foreign Application Priority Data
Nov. 20, 2006 (KR) .................. 10-2006-0114273

(51) Int. Cl.
*C09K 13/00* (2006.01)

(52) U.S. Cl. .............. 252/79.1; 423/263; 423/593.1

(58) Field of Classification Search .................. None
See application file for complete search history.

(56) References Cited

U.S. PATENT DOCUMENTS
4,661,330 A * 4/1987 Chane-Ching et al. ....... 423/263
(Continued)

FOREIGN PATENT DOCUMENTS
JP 06-072711 3/1994
(Continued)

OTHER PUBLICATIONS

Chen et al, synthesis of nanocrystalline cerium oxide particles by the precipitation method, Dec. 9, 2004, Ceramics International, p. 795-802.*

(Continued)

*Primary Examiner* — Binh X Tran
*Assistant Examiner* — David Cathey, Jr.
(74) *Attorney, Agent, or Firm* — McKenna Long & Aldridge LLP

(57) ABSTRACT

Disclosed is a method for directly preparing cerium oxide powder in a solution phase by a) mixing a cerium precursor solution with a precipitant solution to cause a reaction; and b) performing oxidation treatment of the reacted solution, wherein at least one kind of pure organic solvent containing no water is used as a solvent for the cerium precursor solution as well as the precipitant solution to thereby prepare the cerium oxide powder, the particle size of which is adjusted to 50 nm to 3 μm. Cerium oxide powder obtained from the method and CMP slurry comprising the cerium oxide powder as a polishing agent are also disclosed. The method makes it possible to prepare cerium oxide powder with an average particle size of 50 nm or greater and high crystallinity, which is difficult to prepare by the conventional wet precipitation process, by using an organic solvent as a solvent in a wet precipitation process, and the so-prepared cerium oxide powder can be used as a polishing agent for CMP slurry even without being subjected to separate heat treatment.

18 Claims, 3 Drawing Sheets

U.S. PATENT DOCUMENTS

| | | | |
|---|---|---|---|
| 4,663,137 A | * | 5/1987 | Chane-Ching et al. ....... 423/263 |
| 2002/0016060 A1 | | 2/2002 | Matsuzawa et al. |
| 2002/0168923 A1 | * | 11/2002 | Kaufman et al. ............... 451/36 |
| 2004/0241070 A1 | * | 12/2004 | Noh et al. ..................... 423/263 |

FOREIGN PATENT DOCUMENTS

| | | |
|---|---|---|
| WO | WO 03/089374 A1 | 10/2003 |
| WO | WO 2006/011764 A1 | 2/2006 |

OTHER PUBLICATIONS

Mikhail et al, surface area and pore structure of ceric oxide, Jul. 1970, J. appl. Cheml, vol. 20, p. 222-225.*

Li et al, characterization and sintering of nanocrystalline $CeO_2$ powders synthesized by a memic alkoxide method, 2001, Acta Materialia, p. 419-426.*

Uekawa et al, Characterization of $CeO_2$ fine particles prepared by the homogeneous precipitation method with a mixed solution of ethylene glycol and polyethylene glycol, Apr., 2004, J. Mater. Res., vol. 19, No. 4, p. 1087-1092.*

Hua Gu and Mark D. Soucek, Preparation and Characterization of Monodisperse Cerium Oxide Nanoparticles in Hydrocarbon Solvents, Feb. 13, 2007, Chem. Mater. 2007, 19, 1103-1110.*

Pickering, Stephen et al.; "Nanostructured Cerium Oxide: Preparation and Properties of Weakly-agglomerated Powders"; Journal of the European Ceramic Society 1999, 19, p. 1925-1934.

Hsu, Peter Wan et al.; "Preparation and Properties of Monodispersed Colloidal Particles of Lanthanide Compounds" 2. Cerium(IV), Langmuir, 4, 31-37 (1988).

Tani, E. et al.; "Crystallization and crystal growth of $CeO_2$ under hydrothermal conditions", Journal of the Materials Science Letters, 1, 461-462, (1982).

Tsuzuki, Takuya et al.; Synthesis of Ultrafine Ceria Powders by Mechanochemical Processing, Journal of the American Ceramic Society, 84(7), 1453-38, (2001).

* cited by examiner

METHOD FOR PREPARING CERIUM OXIDE POWDER USING ORGANIC SOLVENT AND CMP SLURRY COMPRISING THE SAME

This application is a 35 U.S.C. §371 National Stage entry of International Application No. PCT/KR2007/005815, filed on Nov. 20, 2007, and claims the benefit of Korean Application No. 10-2006-0114273, filed on Nov. 20, 2006 which is hereby incorporated by reference in its entirety.

TECHNICAL FIELD

The present invention relates to a method for preparing cerium oxide powder by using an organic solvent in a wet process, and CMP slurry comprising the so-prepared cerium oxide powder as a polishing agent.

BACKGROUND ART

As generally known in the art, cerium oxide ($CeO_2$) is a high functional ceramic material that is widely used in catalysts, phosphors, cosmetics and polishing agents, and has recently been spotlighted as a polishing agent for use in an STI (Shallow Trench Isolation) process of a semiconductor device and as an optical glass polishing agent. Particularly, in using cerium oxide ($CeO_2$) powder as a polishing agent for CMP slurry, there is an earnest need for synthesis of uniform powder with spherical particle shape and small particle size, but a solid-phase process in high temperature with difficulty in controlling particle size and dispersibility due to its high process temperature is the only method so far known to be industrially applicable to the preparation of cerium oxide ($CeO_2$) powder. In addition, although various wet processes, such as a coprecipitation process, a hydrothermal process, an emulsion process, etc., are relatively easy to control particle size and shape, any research showing that the wet processes result in the successful synthesis of single crystalline cerium oxide ($CeO_2$) powder with an average particle size of 30 nm or greater has not been reported. Thus, much difficulty has been experienced in industrially utilizing cerium oxide ($CeO_2$) powder.

In recent years, there has been an increased interest in research on ceramic powder synthesis and its commercial applications, which was sparked by the recognition that the conventional method of obtaining powder by comminuting minerals imposes restrictions on making the most of superior properties of ceramics. With regard to this, since wet processes, such as a precipitation process, a sol-gel process, a hydrothermal process, and so forth, make it possible to develop new characteristics of ceramics and to obtain high value-added ceramic products by remedying such a drawback of the existing pulverization method, active research on the wet processes is being pursued.

Particularly, much research focuses on the precipitation process and its commercial applications due to its ability to grow crystal particles and control particle size and shape in a solution phase where a much lower temperature than that in a solid-phase reaction prevails, as well as due to its easy control of particle size and shape, which is an advantage common to all the wet processes. Although the wet processes including the precipitation process are easy to prepare fine particles because they are conducted in a build-up manner in which small nuclei grow into larger particles, they have difficulty in preparing particles with large particle size and high crystallinity.

Many researchers attempted to overcome this problem, for example, by simply performing crystal growth after controlling initial starting particle size by use of a seed, carrying out a high-temperature and high-pressure reaction process in a supercritical state above the critical point of water, or using a high concentration of acid/base for increasing solubility, but all of such attempts failed in commercial utilization. Among others, the supercritical fluid process using supercritical water requires equipment capable of a high-temperature and high-pressure reaction, which is extremely costly and consumptive of parts, and has difficulty in controlling reaction conditions, so its commercial applications is still a long way off, even though continued research thereon is being pursued.

In an example of research on the preparation of cerium oxide ($CeO_2$) powder, Matijevic et al. reported that hexagonal plate-like and spherical cerium oxide particles can be obtained from starting materials consisting of $Ce(SO_4)_2 \cdot 4H_2O$, $(NH_4)_4Ce(SO_4)_4 \cdot 2H_2O$, $(NH_4)_2Ce(NO_3)_6$ and others by sealing the starting material in a Pyrex tube, heating the sealed material at a constant temperature to thereby precipitate cerium hydroxide, and then calcining the precipitate at a temperature of about 600° C. (Wan Peter Hsu, Lena Roannquist, Egon Matijevic, Preparation and Properties of Monodispersed Colloidal Particles of Lanthanide Compounds. 2. Cerium(IV), Langmuir, 4, 31-37 (1988)).

In another example of research on the preparation of cerium oxide ($CeO_2$) powder, E. Tani et al. prepared cerium oxide powder with an average particle size of 100 μm by precipitating hydrate from starting materials of cerium nitrate and $NH_4OH$, and firing the precipitated hydrate together with various additives at a temperature of about 500 to 600° C. (E Tani, M. Yoshimura, S Somiya, Crystallization and crystal growth of $CeO_2$ under hydrothermal consitions, Journal of the Materials Science Letters, 1, 461-462, (1982)).

In yet another example of research on the preparation of cerium oxide ($CeO_2$) powder, Takuya Tsuzuki et al. prepared uniform nanosized cerium oxide powder from starting materials of cerium chloride ($CeCl_3$) and NaOH by using a mechanochemical process and a calcination process. When cerium chloride and NaOH with NaCl added thereto were comminuted by steel balls in a primary comminution process, cerium hydroxide was synthesized through a mechanochemical reaction. Also, the synthesized cerium hydroxide was calcined at a temperature of 500° C. or greater to thereby synthesize nanosized spherical cerium oxide. However, the synthesis of cerium oxide powder by such a mechanochemical process has a problem in that a large quantity of Na, which is a fatal contaminant in semiconductor processes, is contained in the synthesized cerium oxide powder, and thus a separate cleaning process is inevitable. Also, due to agglomeration and crystallization according to the calcination process, a large amount of energy is required for the comminution into nanosized particles. Therefore, with regard to its commercialization and application to a CMP process, there are still many problems to be solved (Takuya Tsuzuki, Paul G, McCormick, Synthesis of Ultrafine Ceria Powders by Mechanochemical Processing, Journal of the American Ceramic Society, 84(7), 1453-58, (2001)).

Cerium oxide powder prepared by the above-mentioned precipitation process has a limitation on crystal growth and thus an increase in particle size. On account of this, when cerium oxide powder with a particle size of not less than specific size is to be obtained, there is a problem in that a solid-phase process must be carried out in parallel in such a manner that hydrate corresponding to an intermediate material of cerium oxide is prepared, and then is calcined by heat treatment at a high temperature.

DISCLOSURE OF THE INVENTION

Therefore, the present invention has been made in view of the above-mentioned problems. The inventors of the present invention have discovered that in preparing cerium oxide powder by a wet precipitation process, it is possible to prepare cerium oxide powder with an average particle size of 50 nm or greater and high crystallinity, which is difficult to prepare by the conventional wet precipitation process, by using an organic solvent as a solvent, and the so-prepared cerium oxide powder can be used as a polishing agent for CMP slurry even without being subjected to separate heat treatment.

Therefore, it is an object of the present invention to provide a method for preparing cerium oxide by using an organic solvent in a wet precipitation process, cerium oxide powder prepared by such a method, and CMP slurry comprising the so-prepared cerium oxide powder as a polishing agent.

In accordance with an aspect of the present invention, there is provided a method for directly preparing cerium oxide powder in a solution phase, the method comprising the steps of: a) mixing a cerium precursor solution with a precipitant solution to cause a reaction; and b) performing oxidation treatment of the reacted solution, wherein at least one kind of pure organic solvent containing no water is used as a solvent for the cerium precursor solution as well as the precipitant solution to thereby prepare the cerium oxide powder, the particle size of which is adjusted to 50 nm to 3 μm.

In accordance with another aspect of the present invention, there is provided cerium oxide powder prepared by the above method, on which or within which residual carbon remains in an amount of 0.1 ppm to 100 ppm, and the particle size of which ranges from 50 nm to 3 μm.

In accordance with yet another aspect of the present invention, there is provided CMP slurry comprising the above cerium oxide powder as a polishing agent.

Hereinafter, the present invention will be described in more detail.

Powder synthesis via a solution phase generally goes through two steps, that is, a nucleation step and a crystal growth step, and both of them must be controlled in order to adjust the size of the resultant particles. For example, the larger the number of nuclei in the nucleation step, the smaller the size of the resultant particles. Also, when the degree of supersaturation is high or an energy barrier to nucleation is low during the crystal growth step, it is difficult to produce large and uniform particles because secondary nucleation occurs during the crystal growth step. Thus, the degree of supersaturation of a reaction solution must be appropriately controlled in order to obtain the resultant particles, the overall size of which is large and uniform. Since the degree of supersaturation may be controlled mainly by the concentration of a solute and the solubility of a solution, the appropriate adjustments of the kind of a solvent, the concentration of a solute, reaction temperature, and the solubility of a solution, as well as the proper selection of an additive for controlling particle shape, are important to the preparation of desired ceramic powder.

According to the present invention, in preparing cerium oxide powder in a solution phase, uniform cerium oxide powder with large particle size can be prepared by using an organic solvent as a solvent for a cerium precursor solution and/or a precipitant solution.

Each solvent has a unique dielectric constant, and the dielectric constant of a solvent causes variations in surface energy, surface charge, etc., in a nucleation step and a crystal growth step during the preparation of powder, thereby affecting the agglomeration and growth of nuclei, and thus affecting the size and shape of the resultant powder.

The dielectric constant of a solvent is in proportion to the surface potential (zeta potential) of particles dispersed in the solvent, and a low zeta potential may cause very rapid agglomeration between particulates or nuclei because the particulates or the nuclei resulting from nucleation are in an unstable state due to low surface repellency therebetween. With regard to this, the magnitude of surface repellency between the particulates or the nuclei is almost the same with one another, and thus the particulates or the nuclei may be agglomerated into uniform sized particles. The so-agglomerated secondary particles grow into relatively large sized particles because the primary particulates or the nuclei experience a particle merger process, such as strong agglomeration action or Ostwald ripening, according to reaction conditions including temperature, concentration, etc.

When water is used as a solvent for the liquid-phase precipitation of cerium oxide powder, it is difficult to adjust the size and shape of particles due to a tendency of the particles to have a particle size of less than 20 nm. However, in the present invention, the size of powder particles may be adjusted to 50 nm or greater by using only a pure organic solvent containing no water as a solvent, and particularly particle size may also be adjusted by mixing various organic solvents having different dielectric constants with each other to thereby adjust the dielectric constant of the solvent.

The dielectric constant of the organic solvent used as a solvent in the present invention preferably has a dielectric constant of 20 to 50. Solvents with a dielectric constant of less than 20 show too high volatility to be treated with ease, while solvents with a dielectric constant of greater than 50 results in the high surface potential of particulates resulting from precipitation, and thus relatively small sized particulates are maintained in a stable state, which causes a problem with an increase in particle size.

For reference, water has a dielectric constant of 80.37 (at 20° C.).

Preferred examples of the organic solvent that may be used in the present invention include:

1) Alcohols: methanol, ethanol (dielectric constant at 20° C.: 25.3), propanol, butanol, etc.

2) Glycols: ethylene glycol (dielectric constant at 20° C.: 41.4), propylene glycol, butylene glycol, etc.

3) Ethers: dimethyl ether, ethyl methyl ether, diethyl ether, etc.

4) Esters: methyl acetate, ethyl acetate, propyl acetate, butyl acetate, methyl propionate, ethyl propionate, etc.

5) Ketones: acetone, ethyl methyl ketone, diethyl ketone, methyl isobutyl ketone, etc.

6) Others: formic acid, etc.

Such organic solvents may be used alone or in combination. Additionally, an organic solvent for the cerium precursor solution may be the same as or different from an organic solvent for the precipitant solution.

In the method for preparing cerium oxide powder according to the present invention, step a) is a step of mixing a cerium precursor solution with a precipitant solution to thereby precipitate hydrate in which 3-valent cerium is mixed with 4-valent cerium. The precipitated cerium hydrate may be changed into cerium oxide by the subsequent oxidation treatment step.

There is no particular limitation on cerium precursor applicable in the present invention, so long as it is a cerium compound soluble in an organic solvent, and a cerium precursor in the form of a salt is preferred. Non-limiting examples of the cerium precursor include cerium nitrate, cerium acetate, etc., which may be used alone or in combination.

A cerium precursor solution may be prepared by dissolving the cerium precursor into an organic solvent at a concentration of 0.01 mol to 2 mol. If the cerium precursor solution has a concentration lower than the above concentration range, the yield of cerium oxide powder may decrease. Contrarily, if the cerium precursor solution has a concentration higher than the above concentration range, the resultant powder may become non-uniform in granularity.

The kind of a precipitant applicable in the present invention may have a great effect on the particle size and crystallinity of the resultant powder. However, there is no particular limitation on the kind of a precipitant, so long as the precipitant is an alkaline material capable of adjusting pH of the reaction solution. Non-limiting examples of the precipitant include KOH, $NH_4OH$, and so forth, which may be used alone or in combination.

A precipitant solution may be prepared by dissolving the precipitant into an organic solvent, and the concentration range of the precipitant solution may be 0.5 to 5 times as high as that of the cerium precursor solution to react with the precipitant solution. If the precipitant solution has a concentration less than the above concentration range, precipitation may not occur. Contrarily, if the precipitant solution has a concentration higher than the above concentration range, the growth of powder may be inhibited by too high nucleation rate.

In the method for preparing cerium oxide powder according to the present invention, step b) is a step of performing oxidation treatment of the resultant cerium hydrate to thereby prepare cerium oxide. The oxidation treatment may be achieved by 1) adding an oxidizer to the reaction solution, 2) blowing oxygen-containing gas into the reaction solution, or the like. Non-limiting examples of the oxidizer include peroxide, such as hydrogen peroxide ($H_2O_2$) or ammonium peroxydisulfate ($(NH_4)_2S_2O_8$), oxy acid, such as perchloric acid ($HClO_4$), permanganic acid ($HMnO_4$), or chromic acid ($H_2CrO_4$), etc. The oxidizer may be added in an amount of 1 to 100% by weight, based on the weight of the cerium salt.

Pure oxygen, a mixture of oxygen and nitrogen, air, etc. may be used as the oxygen-containing gas, and the oxygen-containing gas may be blown at a flow rate of 0.01 to 100 cc/min.

Temperature during the precipitation reaction preferably ranges from 30° C. or higher to a temperature of not higher than the boiling point of the solvent, agitation rate during the precipitation reaction may be adjusted to 0 to 300 rpm, and the precipitation reaction is preferably carried out for 30 minutes to 60 hours.

Preferably, the cerium oxide powder prepared in this way is subjected to centrifugal separation and washing, and then is dried for 24 hours. In order to remove agglomerates of the powder, control the particle size of the powder, and remove coarse powder, the cerium oxide powder may also be appropriately pulverized by a ball mill, a jet mill, etc. after the drying.

The cerium oxide powder prepared by the inventive method may have an average particle size of 50 nm to 3 μm.

Additionally, the cerium oxide powder prepared by the inventive method may have a specific surface area of 20 $m^2/g$ to 250 $m^2/g$, and preferably, a specific surface area of 50 $m^2/g$ to 200 $m^2/g$.

Since the cerium oxide powder of the present invention has large specific surface area as specified above, it can improve polishing rate by increasing contact area with a film to be polished during CMP process. Also, since the cerium oxide powder of the present invention has particle size controlled as specified above, it can prevent the occurrence of micro scratches by radically removing macroparticles that may cause scratches on the polished film.

Meanwhile, since the cerium oxide powder of the present invention is prepared through the inventive method characterized by using an organic solvent, the organic solvent may remain on the surface or inside of the cerium oxide powder, even after the centrifugal separation, washing and drying steps. The residual organic solvent may be analyzed by measuring carbon residue with TOC (Total Organic Carbon), or the like. For example, the cerium oxide powder of the present invention may contain carbon remaining in an amount of 0.1 ppm to 100 ppm. Carbon residue analyzed in an amount of less than the above range may be caused by analytical errors or may be detected in the case of using water alone as a solvent.

The cerium oxide powder that has passed through the precipitation, drying, and pulverization steps may be used in its entirety as a polishing agent for CMP slurry. However, in consideration of properties of the powder, it may also be used after being subjected to heat treatment at a temperature of 300 to 350° C. for 10 minutes to 6 hours so as to completely remove moisture contained therein.

CMP slurry comprising the cerium oxide powder as a polishing agent may be prepared by dispersing the cerium oxide powder and a dispersant into a solvent.

The dispersant applicable in the present invention includes a non-ionic polymer dispersant or an anionic polymer dispersant. The non-ionic polymer dispersant includes at least one kind selected from the group consisting of polyvinyl alcohol (PVA), ethylene glycol (EG), glycerin, polyethylene glycol (PEG), polypropylene glycol (PPG), and polyvinyl pyrrolidone (PVP). The anionic polymer dispersant includes at least one kind selected from the group consisting of polyacrylic acid, ammonium polyacrylate, and polyacryl maleic acid. However, the above examples of dispersant are illustrative only, and the scope of the present invention is not limited thereto.

The dispersant is preferably contained in an amount of 0.001 to 10 parts by weight, based on 100 parts by weight of cerium oxide as a polishing agent. More preferably, the dispersant is contained in an amount of 0.02 to 3.0 parts by weight, based on 100 parts by weight of cerium oxide. If the content of the dispersant is less than 0.001 parts by weight, rapid precipitation is caused by low dispersibility, so that the polishing agent cannot be supplied uniformly because precipitation occurs in the middle of the transport of the polishing slurry. Contrarily, if the dispersant is contained in an amount greater than 10 parts by weight, a thick dispersant polymer layer functioning like a cushioning layer may be formed in the vicinity of the polishing agent, which makes it difficult to allow the surface of the polishing agent to come in contact with a silica surface for polishing, resulting in a drop in polishing rate.

Preferably, the CMP slurry is obtained by mixing cerium oxide powder with a dispersant in water and then titrating the resultant solution to pH 6 to 8. For the pH titration, 1N KOH, 1N $HNO_3$, etc. may be used.

Upon the completion of the pH titration, the CMP slurry is preferably subjected to a dispersion stabilization step in order to improve its dispersion and storage stability. The dispersion stabilization step may be performed using a dispersion system generally known in the art. For example, an APEX mill (Kotobuki eng. & mfg. Co., Japan) may be used. When the dispersion stabilization step is performed using the AFEX mill, zirconia beads with a size of 0.01 to 1 mm may be used, cerium oxide slurry may be introduced into the AFEX mill at a feed rate of 10 to 1000 ml/min by using a pump, and a mixture of the zirconia beads and the cerium oxide slurry may be repeatedly circulated in the mill at a rate of 2000 to 5000 rpm over 1 to 20 passes.

BRIEF DESCRIPTION OF THE DRAWINGS

The foregoing and other objects, features and advantages of the present invention will become more apparent from the following detailed description when taken in conjunction with the accompanying drawings in which.

MODE FOR CARRYING OUT THE INVENTION

Figure 1:
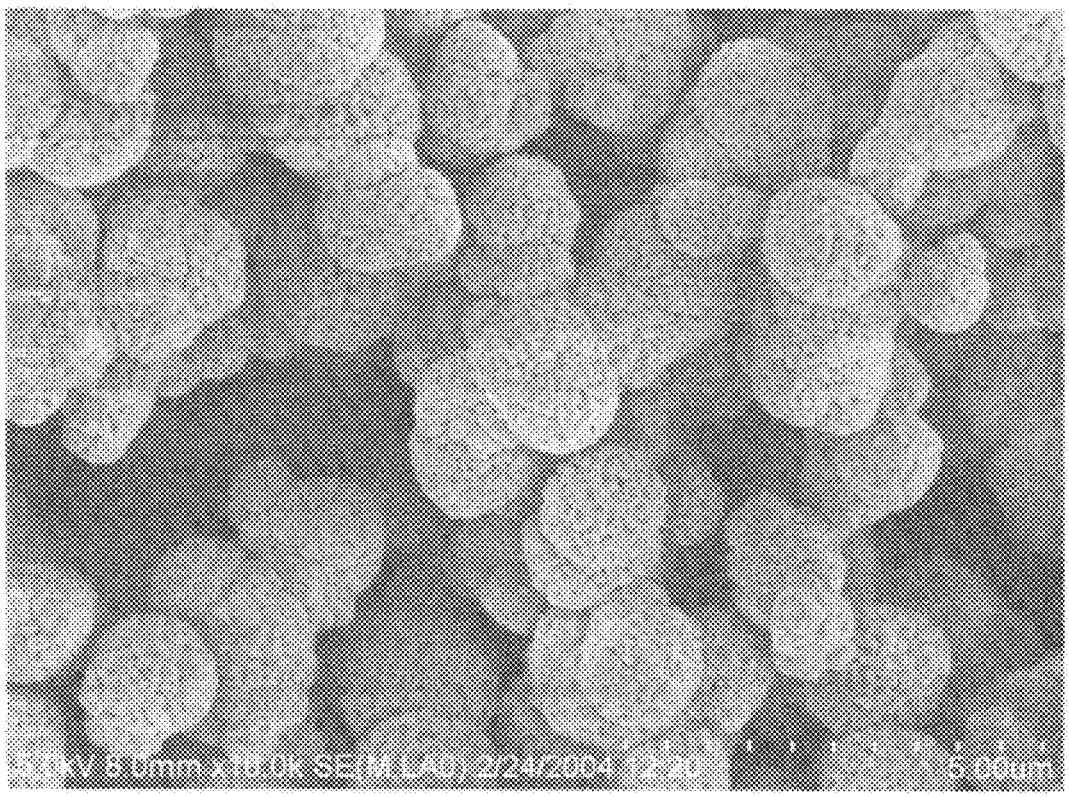
FIG. 1 is a photographic view of cerium oxide powder prepared in Example 1, taken by SEM (Scanning Electron Microscopy)
Figure 2:
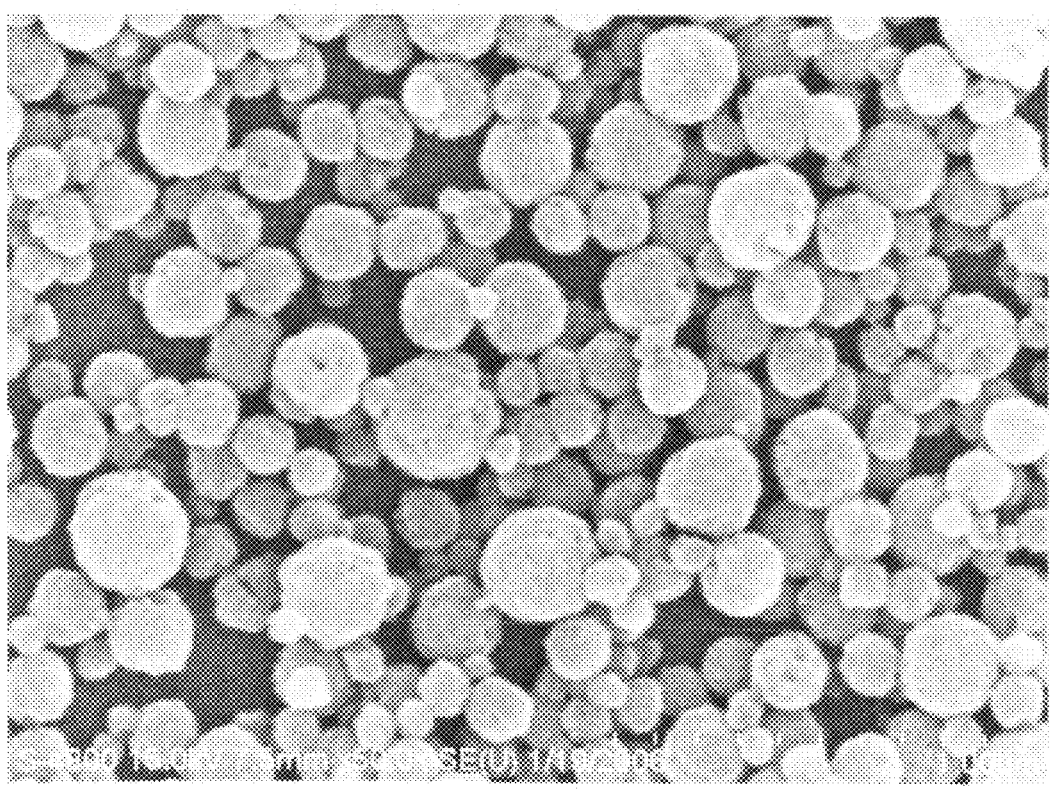
FIG. 2 is a photographic view of cerium oxide powder prepared in Example 2, taken by SEM.
Figure 3:
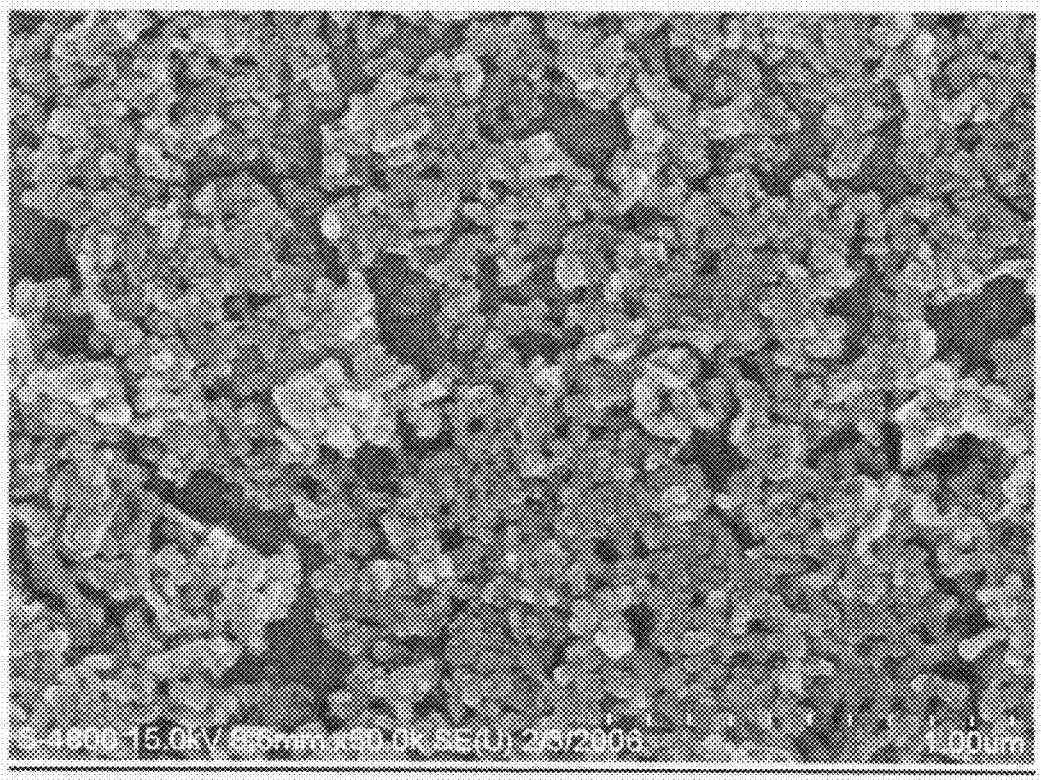
FIG. 3 is a photographic view of cerium oxide powder prepared in Example 3, taken by SEM.
Figure 4:
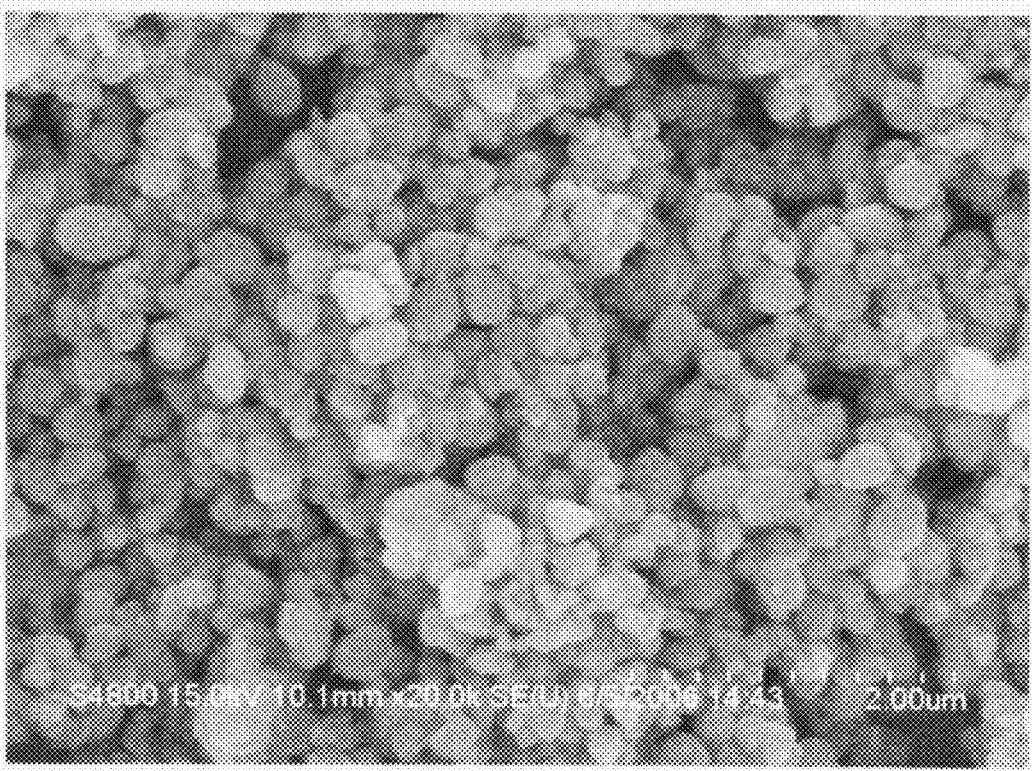
FIG. 4 is a photographic view of cerium oxide powder prepared in Example 4, taken by SEM.
Figure 5:
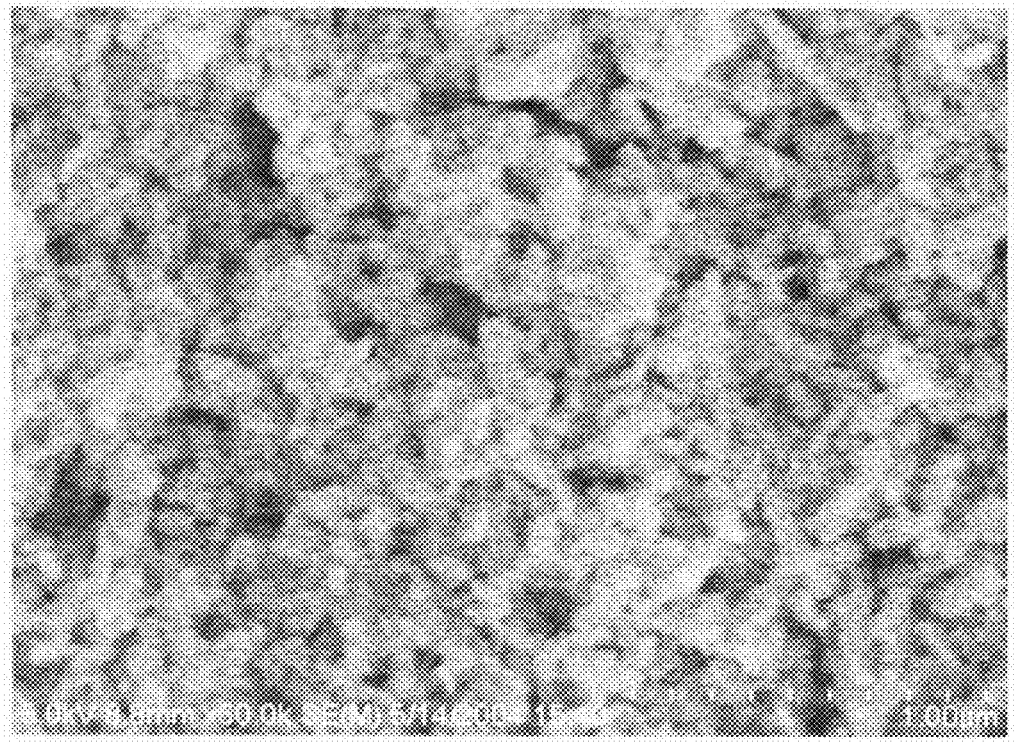
FIG. 5 is a photographic view of cerium oxide powder prepared in Comparative Example 1, taken by SEM.

Reference will now be made in detail to the preferred embodiments of the present invention. It is to be understood that the following examples are illustrative only, and the scope of the present invention is not limited thereto.

Example 1

A first solution was prepared in a vessel by dissolving 0.2 mol of cerium nitrate into a solvent comprising a mixture of 100 ml of ethylene glycol (dielectric constant at 20° C.: 41.4, boiling point: 197° C.) and 400 ml of ethanol (dielectric constant at 20° C.: 25.3, boiling point: 78.3° C.) at room temperature, a second solution was prepared in another vessel by dissolving 0.6 mol of KOH into a solvent comprising a mixture of 100 ml of ethylene glycol and 400 ml of ethanol at room temperature, and then the two solutions were mixed with each other and retained at a temperature of 50° C. The mixed solutions were stirred while 0.76 g of hydrogen peroxide (about 30%) was dripped into them to cause precipitation for 24 hours. In this way, yellowish-brown powder was obtained.

XRD analysis confirmed that the resultant powder has the cubic structure of cerium oxide, particle size analysis showed that the powder has an average particle size of 1 to 3 µm, and BET measurement showed that the powder has a specific surface area of 68 m$^2$/g.

Example 2

Brown powder was obtained in the same manner as described in Example 1, except that a solvent comprising a mixture of 400 ml of ethylene glycol and 100 ml of ethanol was used as a solvent for the first and second solutions, instead of the solvent comprising a mixture of 100 ml of ethylene glycol and 400 ml of ethanol, and the precipitation was performed at a temperature of 120° C., instead of 50° C.

XRD analysis confirmed that the resultant powder has the cubic structure of cerium oxide, particle size analysis showed that the powder has an average particle size of 100 to 300 nm, and BET measurement showed that the powder has a specific surface area of 113 m$^2$/g.

Example 3

Yellowish-brown powder was obtained in the same manner as described in Example 1, except that oxygen ($O_2$) gas was introduced into the mixed solutions at a flow rate of 0.3 cm$^3$/min during the precipitation, instead of dripping the hydrogen peroxide into them.

XRD analysis confirmed that the resultant powder has the cubic structure of cerium oxide, particle size analysis showed that the powder has an average particle size of 50 to 100 nm, and BET measurement showed that the powder has a specific surface area of 52 m$^2$/g.

Example 4

Yellowish-brown powder was obtained in the same manner as described in Example 1, except that air was introduced into the mixed solutions at a flow rate of 0.5 cm$^3$/min during the precipitation, instead of dripping the hydrogen peroxide into them.

XRD analysis confirmed that the resultant powder has the cubic structure of cerium oxide, particle size analysis showed that the powder has an average particle size of 50 to 250 nm, and BET measurement showed that the powder has a specific surface area of 61 m$^2$/g.

Comparative Example 1

A first solution was prepared in a vessel by dissolving 0.2 mol of cerium nitrate into a solvent mixed with 500 ml of water at a room temperature, a second solution was prepared in another vessel by dissolving 0.6 mol of KOH into a solvent mixed with 500 ml of water at room temperature, and then the two solutions were mixed with each other and retained at a temperature of 50° C. The mixed solutions were stirred while 0.76 g of hydrogen peroxide (about 30%) is dripped into them to cause precipitation for 24 hours. In this way, yellowish-brown powder was obtained.

XRD analysis confirmed that the resultant powder has the cubic structure of cerium oxide, and particle size analysis showed that the powder has an average particle size of several to 10 nm.

Example 5

A cerium oxide-dispersed solution was prepared by mixing 0.1 kg of the cerium oxide powder prepared from each of Examples 1 to 4, 0.9 kg of ultrapure water, and 2% by weight of dispersant, based on the weight of the cerium oxide powder, with each other. A polyacrylic acid dispersant (Aldrich, Mw2000) was added as the dispersant. The prepared cerium oxide-dispersed solution was titrated to pH 7.5 by using ammonia water, and then its dispersion stability improvement and particle size control was performed using an AFEX mill. The AFEX mill was used under conditions of: a zirconia bead size of 0.1 mm; a feed rate of 400 ml/min; and 5 circulation passes at a rate of 4250 rpm. In this way, average particle size was adjusted to 150 to 300 nm. Also, the ultrapure water was added to the dispersed solution in such a manner that the dispersed solution contains 2% by weight of polishing particles.

In order to evaluate the polishing performance of the so-prepared CMP slurry, polishing was performed for a wafer on which a silicone oxide film was deposited with a thickness of 7000 Å by using PECVD (Plasma Enhanced Chemical Vapor Deposition), and a wafer on which a silicon nitride film was deposited with a thickness of 1500 Å by using LPCVD (Low Pressure Chemical Vapor Deposition). Each of the wafers was attached to a substrate holder of a CMP polishing device, and was polished for one minute while 100 mL/min of the prepared CMP slurry was added to a polishing table with a polyurethane polishing pad adhered thereto. The substrate holder was pressed against the table with a pressure of 280 g/cm$^2$, and the wafer was polished while the substrate holder and the table rotate at 90 rpm respectively. In the process of this, a down force of 4 psi was applied. On the completion of polishing, the substrate was cleanly washed, and then a change in film thickness between before and after polishing was measured using a film thickness measurement device (Nanospec 6100, Nanometric Co., Ltd., USA).

The result of performing polishing by using CMP slurry to which the cerium oxide powder prepared from each of Examples 1 to 4 and Comparative Example 1 was added is presented below in Table 1.

TABLE 1

| classification | Example 1 | Example 2 | Example 3 | Example 4 | Comparative Example 1 |
|---|---|---|---|---|---|
| particle size | 1~3 μm | 100~300 nm | 50~100 nm | 50~250 nm | several~10 nm |
| specific surface area (m$^2$/g) | 68 | 113 | 52 | 61 | 137 |
| silicon oxide film polishing rate (Å/min) | 3644 | 2800 | 2650 | 1426 | — |
| silicon nitride film polishing rate (Å/min) | 88 | 65 | 62 | 27 | — |
| Selectivity | 41 | 43 | 43 | 52 | — |
| micro scratch | No | no | no | No | — |

It can be noted from Table 1 that the cerium oxide powder prepared from each of Examples 1 to 4 showed superior polishing performance because it is excellent in polishing rate and selectivity and causes no micro scratch. However, the cerium oxide powder prepared from Comparative Example 1 could not be subjected to CMP polishing performance tests because it cannot be prepared into slurry suitable for CMP due to too small particle size and bad dispersibility between particles.

In addition, the organic solvent remaining in the cerium oxide powder prepared from each Example and Comparative Example was dissolved into pure water, and the carbon content of the resultant solution was analyzed. The result of converting the analyzed carbon content into a weight ratio with respect to the cerium oxide powder is presented below in Table 2.

TABLE 2

| Example 1 | ethyleneglycol + ethanol | 21 ppm |
|---|---|---|
| Example 2 | ethyleneglycol + ethanol | 43 ppm |
| Example 3 | ethyleneglycol + ethanol | 79 ppm |
| Comparative Example 1 | pure water | 0.01 ppm or less |

From the above result, it can be noted that residual carbon remaining in the cerium oxide powder prepared by the inventive method using an organic solvent was detected in an amount of 0.1 to 100 ppm, and residual carbon was not detected in the cerium oxide powder prepared by the conventional method using pure water alone as a solvent.

FIGS. 1 to 5 illustrate SEM photographs of the cerium oxide powders prepared from Examples 1 to 4 and Comparative Example 1. It can be noted from these drawings that the cerium oxide powders prepared from Examples 1 to 4 have relatively large and uniform particle sizes, and show various particle sizes according to preparation conditions, but the cerium oxide powder prepared from Comparative Example 1 consists of microparticles with a particle size of 10 or less, and thus is not suitable for CMP polishing due to strong agglomeration between particles and difficult dispersion in slurry.

Figure 6:
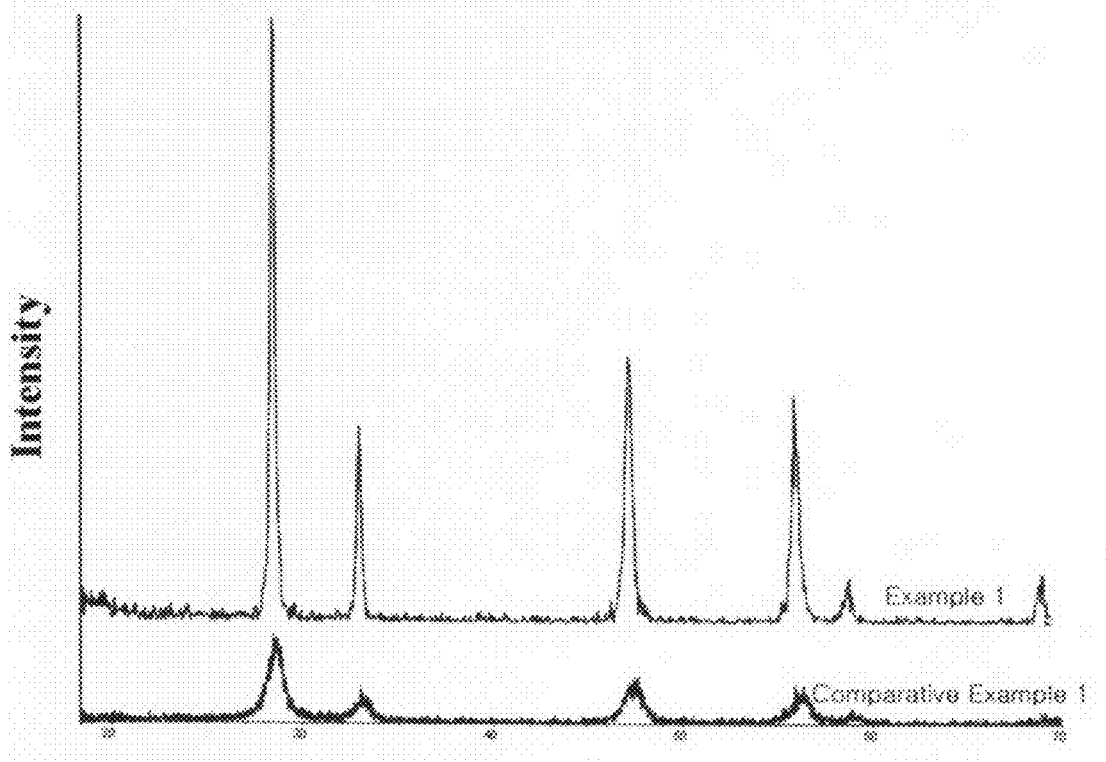
FIG. 6 is a graph illustrating results of XRD (X-Ray Diffraction) analysis of cerium oxide powders prepared in Example 1 and Comparative Example 1.

FIG. 6 illustrates results of XRD analysis of cerium oxide powders prepared from Example 1 and Comparative Example 1. It can be noted from the drawing that the cerium oxide powder prepared from Example 1 is excellent in crystallinity over that prepared from Comparative Example 1, and thus can be used as a polishing agent for CMP slurry even without separate heat treatment.

INDUSTRIAL APPLICABILITY

As can be seen from the foregoing, the present invention makes it possible to prepare cerium oxide powder with an average particle size of 50 nm or greater and high crystallinity, which is difficult to prepare by the conventional wet precipitation process, by using an organic solvent as a solvent in a wet precipitation process, and the so-prepared cerium oxide powder can be used as a polishing agent for CMP slurry even without being subjected to separate heat treatment.

Since the cerium oxide powder prepared using the organic solvent according to the present invention has a specific surface area of 50 m$^2$/g or greater and particle size appropriately controlled without coarse particles, CMP slurry prepared using the cerium oxide powder exhibits high polishing rate and suppresses micro scratches from occurring on a polished material when applied to a CMP process.

While this invention has been described in connection with what is presently considered to be the most practical and preferred embodiment, it is to be understood that the invention is not limited to the disclosed embodiment and the drawings. On the contrary, it is intended to cover various modifications and variations within the spirit and scope of the appended claims.

The invention claimed is:

1. A method for directly preparing cerium oxide powder in a solution phase, the method comprising the steps of:
    a) mixing a cerium precursor solution with a precipitant solution to cause a reaction; and
    b) performing oxidation treatment of the reacted solution, wherein at least one kind of pure organic solvent having a dielectric constant ranging from 20 to 50 and containing no water is used as a solvent for the cerium precursor solution as well as the precipitant solution to thereby prepare the cerium oxide powder, particle size of which is adjusted to 50 nm to 3 μm.

2. The method according to claim 1, wherein the organic solvent is selected from the group consisting of alcohols, glycols, ethers, esters, ketones and formic acid.

3. The method according to claim 1, wherein the precipitant is alkaline material selected from the group consisting of NaOH, KOH and $NH_4OH$.

4. The method according to claim 1, wherein step b) comprises the step of adding an oxidizer to the reacted solution or the step of blowing oxygen-containing gas into the reacted solution.

5. The method according to claim 1, wherein the reaction is carried out at a temperature of not less than 30° C. and less than a boiling point of the solvent.

6. The method according to claim 1, wherein the reaction is carried out for 30 minutes to 60 hours.

7. The method according to claim 1, wherein concentration ratio of the cerium precursor solution and the precipitant solution is in the range of 1:0.5~1:5.

8. The method according to claim 1, further comprising the step of performing heat treatment of the prepared cerium oxide powder at a temperature of 300 to 350° C. for 10 minutes to 6 hours.

9. The method according to claim 1, wherein the prepared cerium oxide powder has a specific surface area of 50 to 200 $m^2/g$.

10. Cerium oxide powder prepared by reacting a cerium precursor solution and a precipitant solution, each of which uses at least one kind of pure organic solvent containing no water as a solvent, with each other and performing oxidation treatment of the reacted solutions according to the method as defined in claim 1, wherein residual carbon, derived from the organic solvent, remains on a surface or inside of the cerium oxide powder in an amount of 0.1 ppm to 100 ppm, and particle size of the cerium oxide powder ranges from 50 nm to 3 μm.

11. The cerium oxide powder according to claim 10, which has a specific surface area of 50 to 200 $m^2/g$.

12. CMP slurry comprising the cerium oxide powder as defined in claim 10 as a polishing agent.

13. Cerium oxide powder prepared by reacting a cerium precursor solution and a precipitant solution, each of which uses at least one kind of pure organic solvent containing no water and having a dielectric constant ranging from 20 to 50 as a solvent, with each other and performing oxidation treatment of the reacted solutions according to the method as defined in claim 1, wherein residual carbon remains on a surface or inside of the cerium oxide powder in an amount of 0.1 ppm to 100 ppm, and particle size of the cerium oxide powder ranges from 50 nm to 3 μm.

14. The cerium oxide powder according to claim 13, which has a specific surface area of 50 to 200 $m^2/g$.

15. CMP slurry comprising the cerium oxide powder as defined in claim 13 as a polishing agent.

16. Cerium oxide powder prepared by reacting a cerium precursor solution and a precipitant solution, each of which uses at least one kind of pure organic solvent containing no water as a solvent, with each other and performing oxidation treatment of the reacted solutions according to the method as defined in claim 4,
  wherein the oxidation treatment is to add an oxidizer to the reacted solution or to blow oxygen-containing gas into the reacted solution, and
  residual carbon remains on a surface or inside of the cerium oxide powder in an amount of 0.1 ppm to 100 ppm, and particle size of the cerium oxide powder ranges from 50 nm to 3 μm.

17. The cerium oxide powder according to claim 16, which has a specific surface area of 50 to 200 $m^2/g$.

18. CMP slurry comprising the cerium oxide powder as defined in claim 16 as a polishing agent.

\* \* \* \* \*